United States Patent
Lee

(10) Patent No.: US 7,034,595 B2
(45) Date of Patent: Apr. 25, 2006

(54) MULTI-PHASE CLOCK SIGNAL GENERATORS AND METHODS OF GENERATING MULTI-PHASE CLOCK SIGNALS

(75) Inventor: Soo-Hyoung Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/835,308

(22) Filed: Apr. 29, 2004

(65) Prior Publication Data

US 2005/0040875 A1    Feb. 24, 2005

(30) Foreign Application Priority Data

Aug. 23, 2003    (KR) .................... 10-2003-0058495

(51) Int. Cl.
  *H03K 5/13*    (2006.01)
(52) U.S. Cl. .................... 327/233; 327/295
(58) Field of Classification Search ........... 327/233, 327/254, 256, 257, 264, 295
  See application file for complete search history.

(56) References Cited

U.S. PATENT DOCUMENTS

| | | | | |
|---|---|---|---|---|
| 4,417,158 A | * | 11/1983 | Ito et al. ................ | 327/295 |
| 4,477,738 A | * | 10/1984 | Kouba ................... | 327/292 |
| 4,691,122 A | * | 9/1987 | Schnizlein et al. ...... | 327/203 |
| 4,827,157 A | * | 5/1989 | Machida et al. ......... | 327/259 |
| 5,592,115 A | * | 1/1997 | Kassapian .............. | 327/239 |
| 5,652,535 A | * | 7/1997 | Kim et al. .............. | 327/259 |
| 5,952,863 A | * | 9/1999 | Jones et al. ............ | 327/295 |
| 5,955,906 A | * | 9/1999 | Yamaguchi ............. | 327/259 |
| 5,966,037 A | * | 10/1999 | Truong et al. .......... | 327/239 |
| 6,331,800 B1 | * | 12/2001 | Radjassamy ........... | 327/566 |
| 6,831,493 B1 | * | 12/2004 | Ma ....................... | 327/175 |
| 6,838,922 B1 | * | 1/2005 | Melcher ................ | 327/291 |
| 2001/0043103 A1 | * | 11/2001 | Uehara et al. .......... | 327/175 |

* cited by examiner

*Primary Examiner*—Terry D. Cunningham
*Assistant Examiner*—Thomas J. Hiltunen
(74) *Attorney, Agent, or Firm*—Myers Bigel Sibley & Sajovec

(57) ABSTRACT

A multi-phase clock signal generator provides multiple clock signals from an input clock signal, the multiple clock signals being inverted from one another and having substantially the same delay and duty cycle characteristics. Methods of generating multiple clock signals are also provided.

17 Claims, 14 Drawing Sheets

MULTI-PHASE CLOCK SIGNAL GENERATORS AND METHODS OF GENERATING MULTI-PHASE CLOCK SIGNALS

CLAIM OF PRIORITY

The present application claims priority from Korean Patent Application No. 2003-58495 filed on Aug. 23, 2003, the disclosure of which is incorporated herein by reference in its entirety.

FIELD OF THE INVENTION

The present invention relates to a multi-phase clock signal generators and methods of generating multi-phase clock signals.

BACKGROUND OF THE INVENTION

In many electronic devices that provide for digital to analog conversion, an input analog signal is sampled, amplified and converted into a digital data signal in an analog front end (AFE) circuit so as to convert the input analog signal into the digital data signal. The AFE circuit typically employs a programmable gain amplifier (PGA) that adjusts a gain characteristic appropriate for input analog signals having various amplitudes.

The PGA typically controls the gain using a capacitor array rather than a resistor array because the PGA is implemented by an integrated circuit. In particular, the PGA switches an input signal in response to first and second clock signals to output an amplified signal.

A switched capacitor circuit receives an input clock signal and first and second clock signals. The active (or inactive) period of the first and second clock signals typically do not overlap each other. The first clock signal typically has an inverted phase with respect to the second clock signal.

The first clock signal may have the same phase as that of the input clock signal, and the second clock signal have an inverted phase with respect to the input clock signal. Typically, to provide the different phases of the first and second clock signals, the first clock signal passes through an even number of inverters, and the second clock signal passes through an odd number of inverters. Thus, there is a difference between the number of the inverters through which the first clock signal passes and the number of the inverters through which the second clock signal passes. The difference is typically an odd number of inverters, or at least one. When the difference is one, the first clock signal has a timing skew corresponding to one inverter with respect to the second clock signal. The timing skew may cause problems when the PGA is implemented for high speed applications.

Thus, conventionally, a signal path of the first clock signal and a signal path of the second clock cross each other so as to reduce the timing skew corresponding to one inverter. The timing skew corresponding to a delay of one inverter is divided between (or shared by) the first and second clock signals, and thus the first clock signal has a same timing skew characteristic as that of the second clock signal.

However, according to above method, the duty ratio of the first clock signal having the same phase as that of the input clock signal is less than that of the second clock signal having the inverted phase with respect to the input clock signal due to the difference of the numbers of inverters through which the first and second clock signals pass. The duty ratio difference between the first and second clock signals may lower the reliability of the operation of the PGA.

SUMMARY OF THE INVENTION

Embodiments of the present invention provide a multi-phase clock signal generator that includes a first inverter that is configured to invert an input clock signal to generate an inverted input clock signal. A duty cycle compensation circuit is configured to substantially remove a difference between a delay of the input clock signal and a delay of the inverted input clock signal to generate a first compensated input clock signal and a second compensated input clock signal having substantially the same duty cycle. A first logic circuit is configured to generate a second delayed signal using the first compensated input clock signal and a first delayed signal. The first delayed signal has substantially the same phase as a phase of the input clock signal and has a first delay with respect to the input clock signal. The second delayed signal has a substantially inverted phase with respect to the input clock signal and has a second delay with respect to the input clock signal. A second logic circuit is configured to generate the first delayed signal using the second compensated input clock signal and the second delayed signal. A second inverter is configured to invert the second delayed signal to generate a first output clock signal and a third inverter is configured to invert the first delayed signal to generate a second output clock signal.

In certain embodiments of the present invention, the duty cycle compensation circuit includes an input buffer that provides the input clock signal, a first set of three cascade connected inverters coupled between an output terminal of the input buffer and an input terminal of the first logic circuit and a second set of three cascade connected inverters coupled between an output terminal of the first inverter and an input terminal of the first logic circuit. A first inverter of the second set of three cascade connected inverters has an output coupled to an input of a third inverter of the first set of three cascade connected inverters and a first inverter of the first set of three cascade connected inverters has an output coupled to an input of a third inverter of the second set of three cascade connected inverters. A fourth inverter is coupled between an input terminal of the first set of three cascade connected inverters and an output terminal of the first set of three cascade connected inverters. A fifth inverter is coupled between an input terminal of the second set of three cascade connected inverters and an output terminal of the second set of three cascade connected inverters.

Additional embodiments of present invention also include a sixth inverter coupled between the output terminal of the input buffer and an output terminal of the first inverter of the first set of three cascade connected inverters and a seventh inverter coupled between the output terminal of the first inverter and an output terminal of the first inverter of the second set of three cascade connected sixth inverters. A third logic circuit may also be provided that is configured to generate a third clock signal using an output signal of the sixth inverter and the first delayed signal. A fourth logic circuit may also be provided that is configured to generate a fourth clock signal using an output signal of the seventh inverter and the second delayed signal. The third logic circuit may include a first NAND gate for receiving an output signal of the sixth inverter and the first delayed signal and a buffer that is configured to buffer an output signal of the first NAND gate. The fourth logic circuit may include a second NAND gate for receiving an output signal of the seventh inverter and the second delayed signal and a buffer that is configured to buffer an output signal of the second NAND gate.

In further embodiments of the present invention, the first logic circuit includes a first buffer that is configured to buffer the first compensated input clock signal, a first NAND gate for receiving an output signal of the first buffer and the first delayed signal and a second buffer that is configured to buffer an output signal of the first NAND gate to generate the second delayed signal. The second logic circuit may include a third buffer that is configured to buffer the second compensated input clock signal, a second NAND gate for receiving an output signal of the third buffer and the second delayed signal and a fourth buffer that is configured to buffer an output signal of the second NAND gate to generate the first delayed signal.

Still further embodiments of the present invention include methods of generating a plurality of clock signals having multi-phase by inverting an input clock signal to generate an inverted input clock signal and substantially removing a first difference between a first phase delay of the buffered input clock signal and a second phase delay of the inverted input clock signal to generate a first compensated input clock signal and a second compensated input clock signal each having substantially the same duty cycle. A second delayed signal is generated using the first compensated input clock signal and a first delayed signal. The first delayed signal has a substantially same phase as a phase of the input clock signal and has a first delay with respect to the input clock signal. The second delayed signal has a substantially inverted phase with respect to the input clock signal and has a second delay with respect to the input clock signal. The first delayed signal is generated using the second compensated input clock signal and the second delayed signal. The second delayed signal is inverted to generate the first clock signal and the first delayed signal is inverted to generate the second clock signal.

In additional embodiments of the present invention, removing the first difference includes inverting the input clock signal to generate a first signal, inverting the input clock signal to generate a second signal, inverting the input clock signal to generate a third signal, inverting the inverted input clock signal to generate a fourth signal, inverting the inverted input clock signal to generate a fifth signal, inverting the inverted input clock signal to generate a sixth signal, inverting a first node signal to generate a first composite signal, the first node signal mixed with the first signal, the third signal and a second composite signal, inverting a second node signal to generate the second composite signal, the second node signal mixed with the fourth signal, the sixth signal and the first composite signal, mixing a seventh signal with the second signal to generate the first compensated input clock signal, the seventh signal having an inverted phase with respect to the first composite signal and mixing an eighth signal with the fifth signal to generate the second compensated input clock signal, the eighth signal having an inverted phase with respect to the second composite signal.

In further embodiments of the present invention, a third clock signal is generated using the first signal and the first delayed signal and a fourth clock signal is generated using the sixth signal and the second delayed signal. Furthermore, generating the second delayed signal may include buffering the first compensated input clock signal to output a buffered first compensated input clock signal, performing a logical NAND operation on the buffered first compensated input clock signal and the first delayed signal and buffering a result of the NAND operation to generate the second delayed signal. Generating the first delayed signal may include buffering the second compensated input clock signal to output a buffered second compensated input clock signal, performing a logical NAND operation on the buffered second compensated input clock signal and the second delayed signal and buffering a result of the NAND operation to generate the first delayed signal.

In additional embodiments of the present invention, a multi-phase clock signal generator includes a clock signal generator circuit configured to receive an input clock signal and generate a first delayed clock signal that has a first phase with respect to the input clock signal and a second delayed clock signal that has a phase that is substantially the phase of the first delayed clock signal inverted. The first delayed clock signal and the second delayed clock signal are delayed substantially a same amount with respect to the input clock signal have substantially the same duty cycle characteristics as each other.

In further embodiments of the present invention, the clock signal generator circuit includes an input inverter circuit that inverts the input clock signal to provide an inverted input clock signal and first and second cross-coupled sequential inverter circuits. The first cross-coupled invert circuit receives the input clock signal as an input and the second cross-coupled inverter circuit receives the inverted input clock signal as an input. First and second inverter circuits each have an input coupled to a respective inputs of the first and second cross-coupled sequential inverter circuits and an output coupled to the respective output of the first and second cross-coupled. The output of the first cross-coupled sequential inverter circuit and the output of the first inverter circuit provide the first delayed clock signal and the output of the second cross-coupled sequential inverter circuit and the output of the second inverter circuit provides the second delayed clock signal.

The first and second cross-coupled sequential inverter circuits may be cross-coupled by an output a first inverter in the first cross-coupled sequential inverter circuit being coupled to an output of a second inverter in the second cross-coupled sequential inverter circuit that is a subsequent inverter to a third inverter in the second cross-coupled sequential inverter circuits that corresponds to the location in the sequence of inverters of the first inverter in the first cross-coupled sequential inverter circuit and an output of the third inverter being coupled to an output of a next subsequent inverter to a fourth inverter in the first cross-coupled sequential inverter circuits that is subsequent to the first inverter in the first cross-coupled sequential inverter circuit.

The multi-phase clock signal generator may also include first and second NAND circuits. The first NAND circuit performs a logical NAND of an output signal of the first cross-coupled sequential inverter circuit with an output signal of the second NAND circuit to provide a first clock signal and the second NAND circuit performs a logical NAND of an output signal of the second cross-coupled sequential inverter circuit with an output signal of the first NAND circuit to provide a second clock signal. A first buffer circuit may also be provided between the output of the first cross-coupled sequential inverter circuit and the first NAND circuit such that the first NAND circuit provides a logical NAND of a buffered output signal of the first cross-coupled sequential inverter circuit and a second buffer circuit may be provided between the output of the second cross-coupled sequential inverter circuit and the second NAND circuit such that the second NAND circuit provides a logical NAND of a buffered output signal of the second cross-coupled sequential inverter circuit. A third buffer circuit may be provided between the output of the second NAND circuit and the first NAND circuit such that the first NAND circuit provides a logical NAND of a buffered output signal of the second NAND circuit and A fourth buffer circuit may be provided between the output of the first NAND circuit and the second NAND circuit such that the second NAND circuit provides a logical NAND of a buffered output signal of the first NAND circuit.

In further embodiments of the present invention, the multi-phase clock signal generator includes a third inverter circuit that inverts the buffered output signal of the first NAND circuit to provide the first clock signal and a fourth inverter circuit that inverts the buffered output signal of the second NAND circuit to provide the second clock signal.

In still other embodiments of the present invention, the multi-phase clock signal generator includes a third inverter circuit coupled between an input and an output of an inverter of the first cross-coupled sequential inverter circuit, a fourth inverter circuit coupled between an input and an output of an inverter of the second cross-coupled sequential inverter circuit and third and fourth NAND circuits, wherein the first NAND circuit performs a logical NAND of an output signal of the third inverter circuit with an output signal of the third buffer circuit to provide a third clock signal and the fourth NAND circuit performs a logical NAND of an output signal of the fourth inverter circuit with an output signal of the fourth buffer circuit to provide a fourth clock signal.

DESCRIPTION OF EMBODIMENTS OF THE INVENTION

Figure 1:
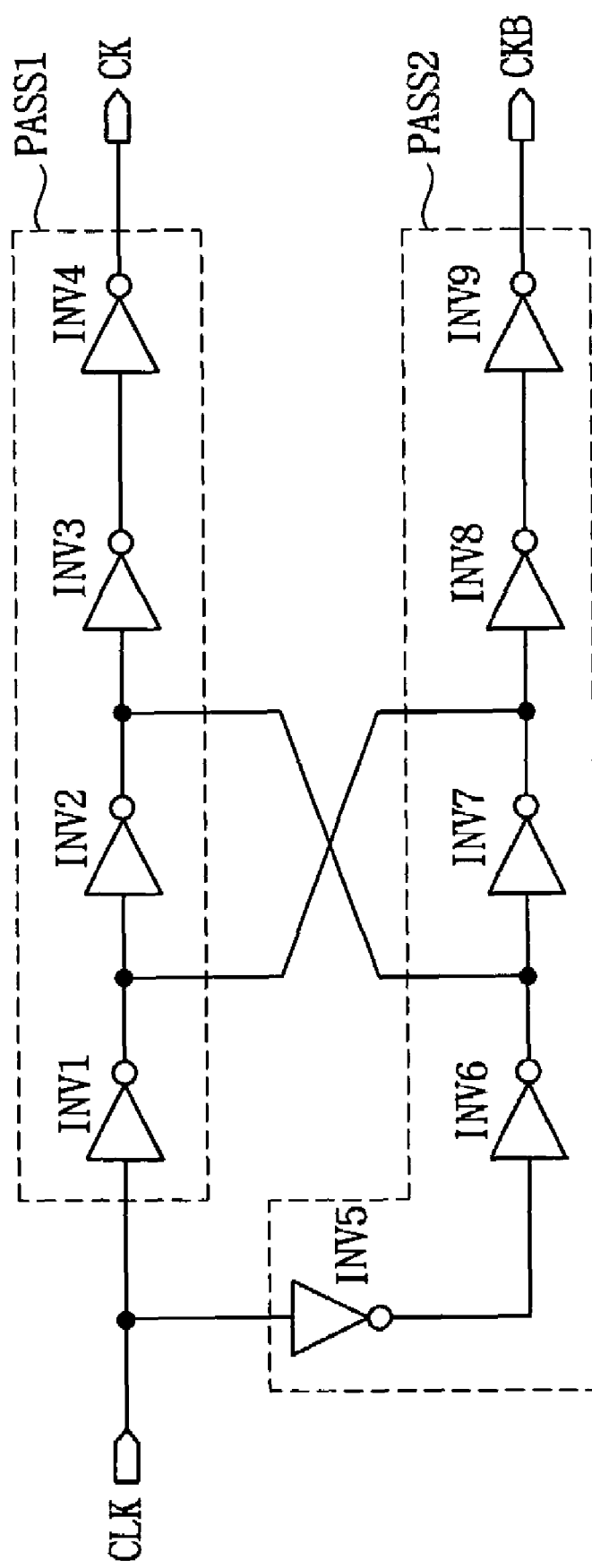
FIG. 1 is a circuit diagram showing an example of a clock signal generator.

The present invention will now be described more fully with reference to the accompanying drawings, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art In the drawings, the size or thickness of layers and regions are exaggerated for clarity. Like numbers refer to like elements. As used herein the term "and/or" includes any and all combinations of one or more of the associated listed items.

It will be understood that although the terms first and second may be used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, and similarly, a second without departing from the teachings of the present invention.

Figure 2:
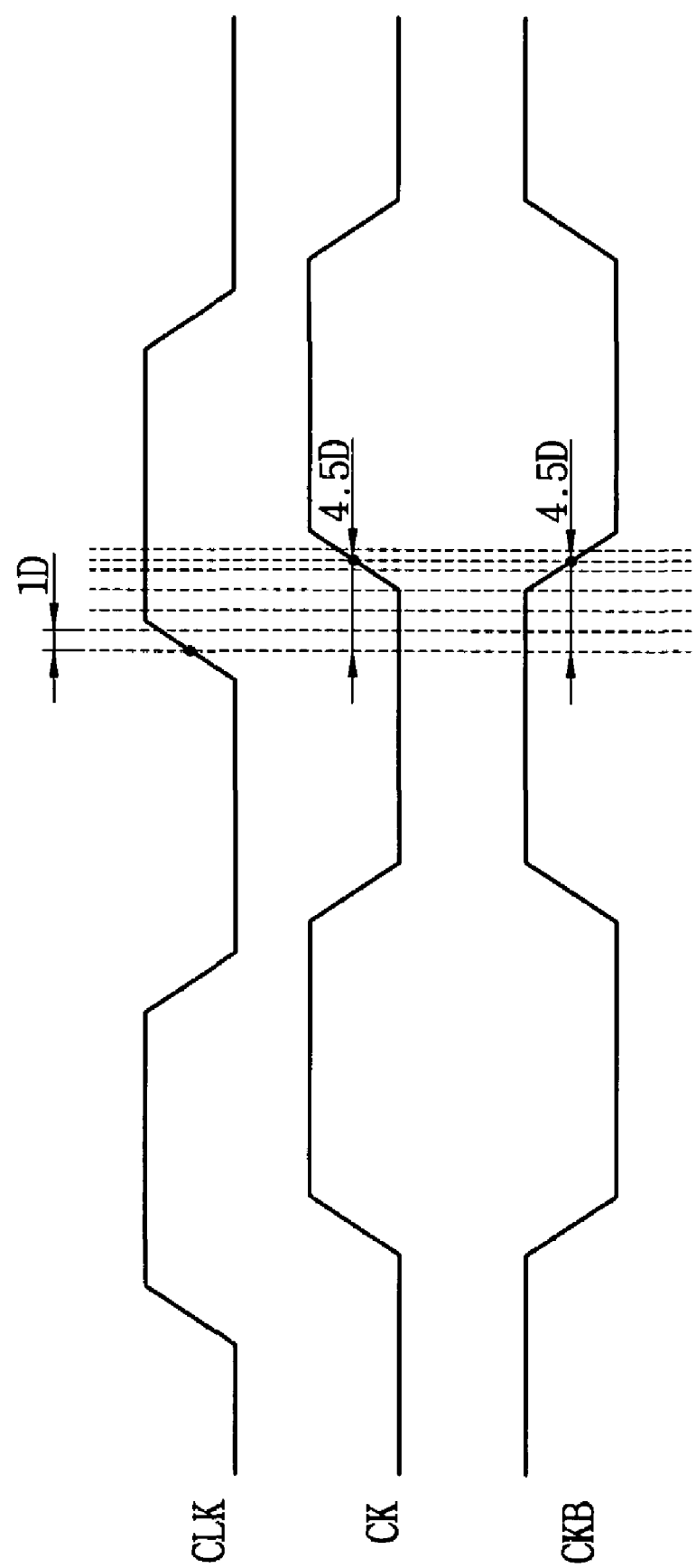
FIG. 2 is a timing diagram showing the operation of the clock signal generator of FIG. 1.

FIG. 1 is a circuit diagram showing an example of a clock signal generator, and FIG. 2 is a timing diagram showing the operation of the clock signal generator of FIG. 1.

Referring to FIG. 1, an input clock signal CLK passes through a first path PASS1 that includes four cascade connected inverters INV1, INV2, INV3 and INV4 so that the inverter INV4 outputs a first clock signal CK having a same phase as the input clock signal CLK, and the input clock signal CLK passes through a second path PASS2 that includes five cascade connected inverters INV5, INV6, INV7, INV8 and INV9 so that the inverter INV9 outputs a second clock signal CKB having an inverted phase with respect to the input clock signal CLK. An output terminal of the inverter INV2 is connected to an input terminal of the inverter INV7, and an output terminal of the inverter INV7 is connected to an input terminal of the inverter INV2.

Thus, a one-stage delayed clock signal is mixed with a three-stage delayed clock signal at an input terminal of inverter INV2, and a two-stage delayed clock signal is mixed with a two-stage delayed clock signal at an input terminal of inverter INV7 due to the cross connection between the inverters INV2 and INV7. Therefore, because one stage delay corresponding to a delay of one inverter is divided between the first and second paths PASS1 and PASS2, the first clock signal CK has substantially a same delay characteristic as that of the second clock signal CKB. Namely, as shown in FIG. 2, the first and second clock signals CK and CKB respectively have 4.5d delay where "d" represents one stage delay corresponding to a delay of one inverter. The first clock signal CK having the same phase as the input clock signal CLK has substantially the same delay characteristic as that of the second clock signal CKB having the inverted phase with respect to the first clock signal CK.

Figure 3:
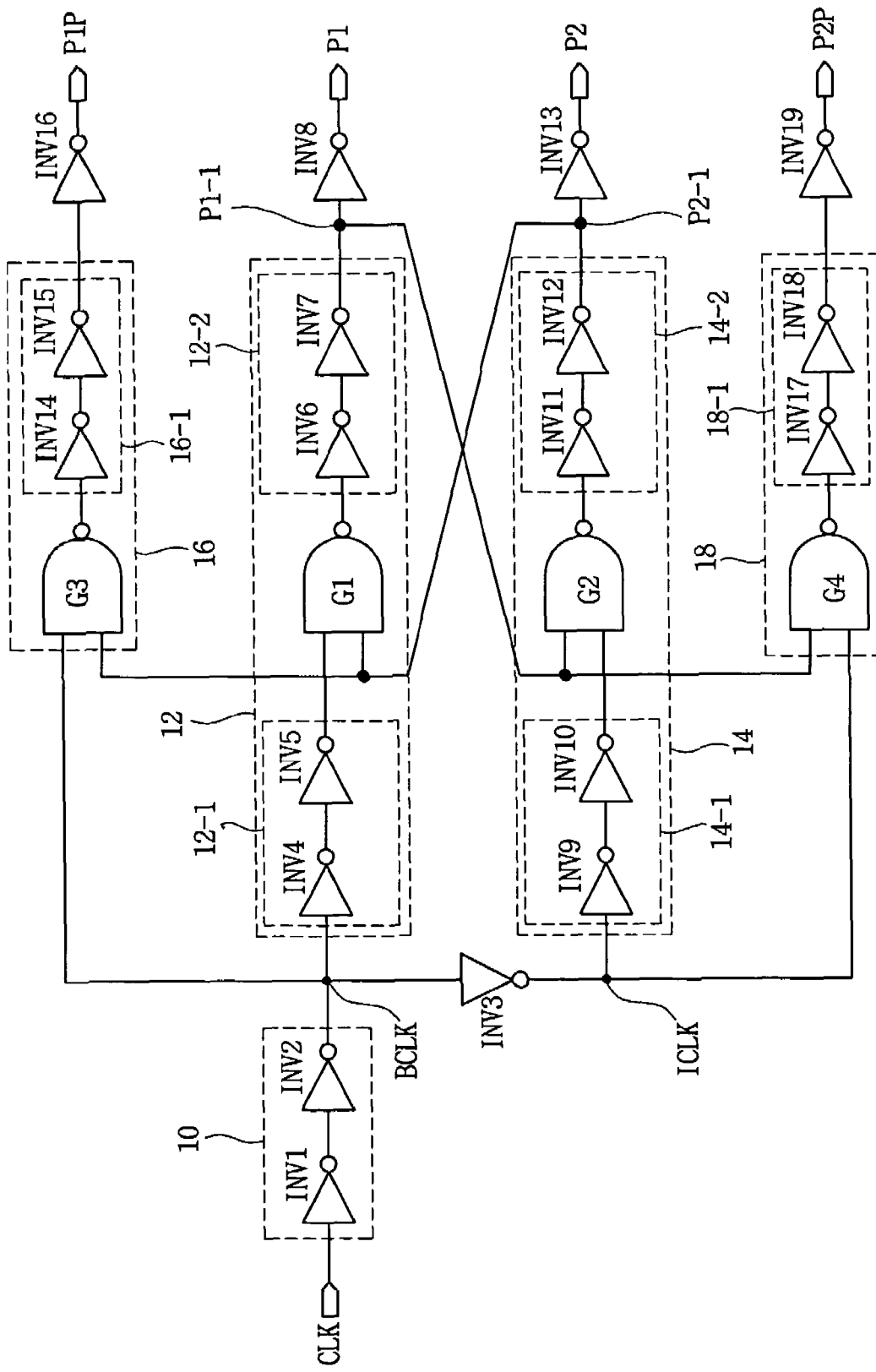
FIG. 3 is a circuit diagram showing a clock signal generator according to particular embodiments of the present invention.

FIG. 3 is a circuit diagram showing a clock signal generator according to exemplary embodiments of the present invention.

Referring to FIG. 3, the clock signal generator includes an input buffer 10, first, second, third and fourth logic circuits 12, 14, 16 and 18 and inverters INV3, INV8, INV13, INV16 and INV19. The input buffer 10 includes two cascade-connected inverters INV1 and INV2, and buffers an input clock signal CLK to output a buffered input clock signal BCLK. An inverter INV3 inverts the buffered input clock signal BCLK to generate an inverted input clock signal ICLK.

A first logic circuit 12 includes a first buffer 12-1, a NAND gate G1 and a second buffer 12-2. The buffer 12-1 includes inverters INV4 and INV5, and buffers the buffered input clock signal BCLK. The NAND gate G1 receives an output signal of the first buffer 12-1 and a first delayed signal P2-1 to perform a logical NAND operation. The first delayed signal P2-1 has substantially the same phase as a phase of the input clock signal CLK and has a first delay with respect to the input clock signal CLK. The second buffer 12-2 buffers an output signal of the NAND gate G1 to output a second delayed signal P1-1. The second delayed signal P1-1 has a substantially inverted phase with respect to the input clock signal CLK and has a second delay with respect to the input clock signal CLK.

The inverter INV8 inverts the second delayed signal P1-1 to output a first clock signal P1.

A second logic circuit 14 includes a first buffer 14-1, a NAND gate G2 and a second buffer 14-2. The first buffer 14-1 includes inverters INV9 and INV10, and buffers the inverted input clock signal ICLK. The NAND gate G2 receives an output signal of the first buffer 14-1 and the second delayed signal P1-1 to perform the logical NAND operation. The second buffer 14-2 buffers an output signal of the NAND gate G2 to output the first delayed signal P2-1.

The inverter INV13 inverts the first delayed signal P2-1 to output a second clock signal P2.

A third logic circuit 16 includes a NAND gate G3 and a buffer 16-1. The NAND gate G3 receives the buffered input clock signal BCLK and the first delayed signal P2-1 and performs the logical NAND operation. The buffer 16-1 buffers an output signal of the NAND gate G3, and an inverter INV16 inverts an output of the buffer 16-1 to output a third clock signal (or a first prime clock signal) P1P.

A fourth logic circuit 18 includes a NAND gate G4 and a buffer 18-1. The AND gate G4 receives the inverted input clock signal ICLK and the second delayed signal P1-1 and performs the logical NAND operation. The buffer 18-1 buffers an output signal of the NAND gate G4, and an inverter INV19 inverts an output of the buffer 18-1 to output a fourth clock signal (or a second prime clock signal) P2P.

Figure 4:
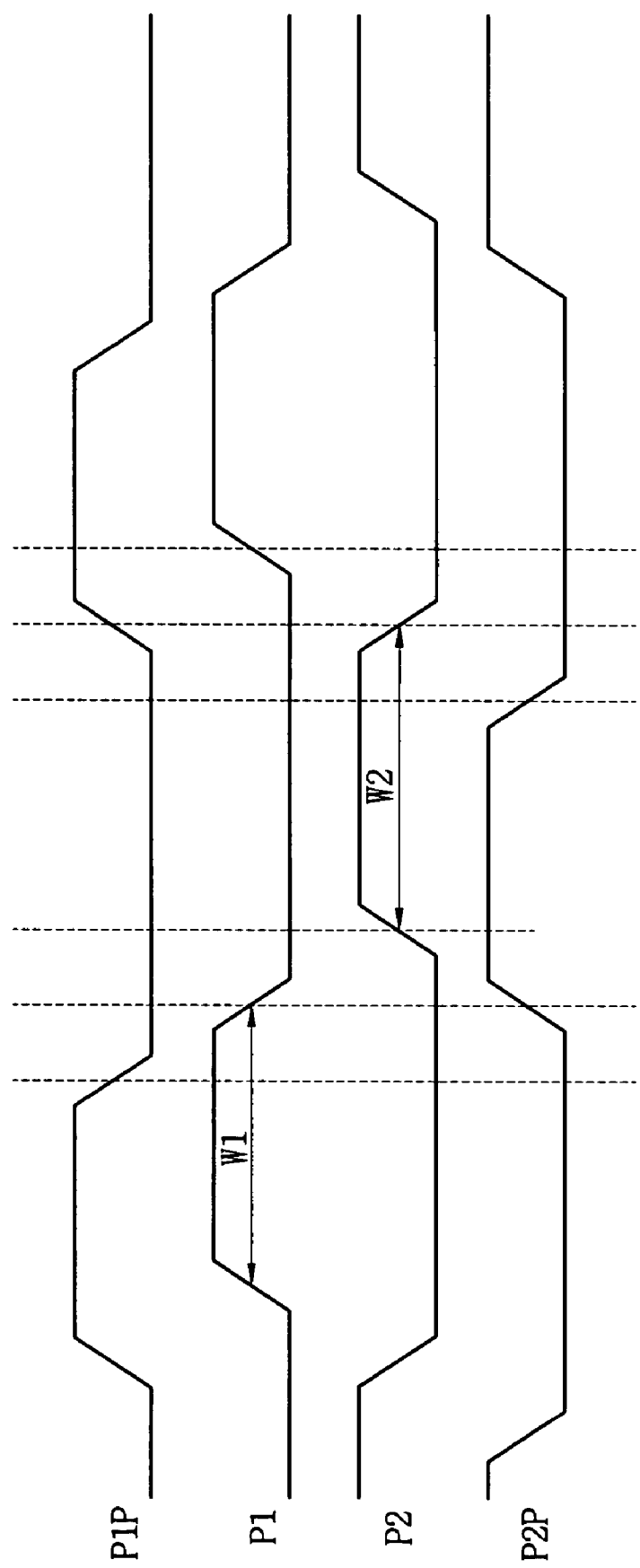
FIG. 4 is a timing diagram showing the operation of the clock signal generator of FIG. 3.

FIG. 4 is a timing diagram showing the operation of the clock signal generator of FIG. 3.

Referring to FIG. 4, a falling edge of the third clock signal P1P leads a falling edge of the first clock signal P1. A falling edge of the fourth clock signal P2P leads a falling edge of the second clock signal P2. An active (or inactive) period of the first clock signal P1 does not overlap with an active (or inactive) period of the second clock signal P2. In addition, a delay of the first clock signal P1 with respect to the input clocks signal CLK is substantially the same as a delay of the second clock signal P2 with respect to the input clocks signal CLK.

The second delayed signal P1-1 has seven-stage delayed (7d) with respect to the input clock signal CLK. The second delayed signal P1-1 having seven-stage delayed (7d) and an output signal of the buffer 14-1 having five-stage delay (5d) are input to the NAND gate G2. Thus, a width of an active period of the second clock signal P2 is reduced by a width corresponding to two-stage delays (2d) at both edges of the active period of the second clock signal P2, so that the active period of the second clock signal P2 has an width W2.

The first delayed signal P2-1 has an eight-stage delay (8d) with respect to the input clock signal CLK. The first delayed signal P2-1 having and eight-stage delay phase (8d) and an output signal of the buffer 12-1 having a four-stage delay (4d) are input to the NAND gate G1. Thus, a width of an active period of the first clock signal P1 is reduced by a width corresponding to a four-stage delay (4d) at both edges of the active period of the first clock signal P1, so that the active period of the first clock signal P1 has an width W1.

Therefore, the width (W1) of the active period of the first clock signal P1 is narrower than the width (W2) of the active period of the second clock signal P2 by a width corresponding to a four-stage delay (4d).

Figure 5:
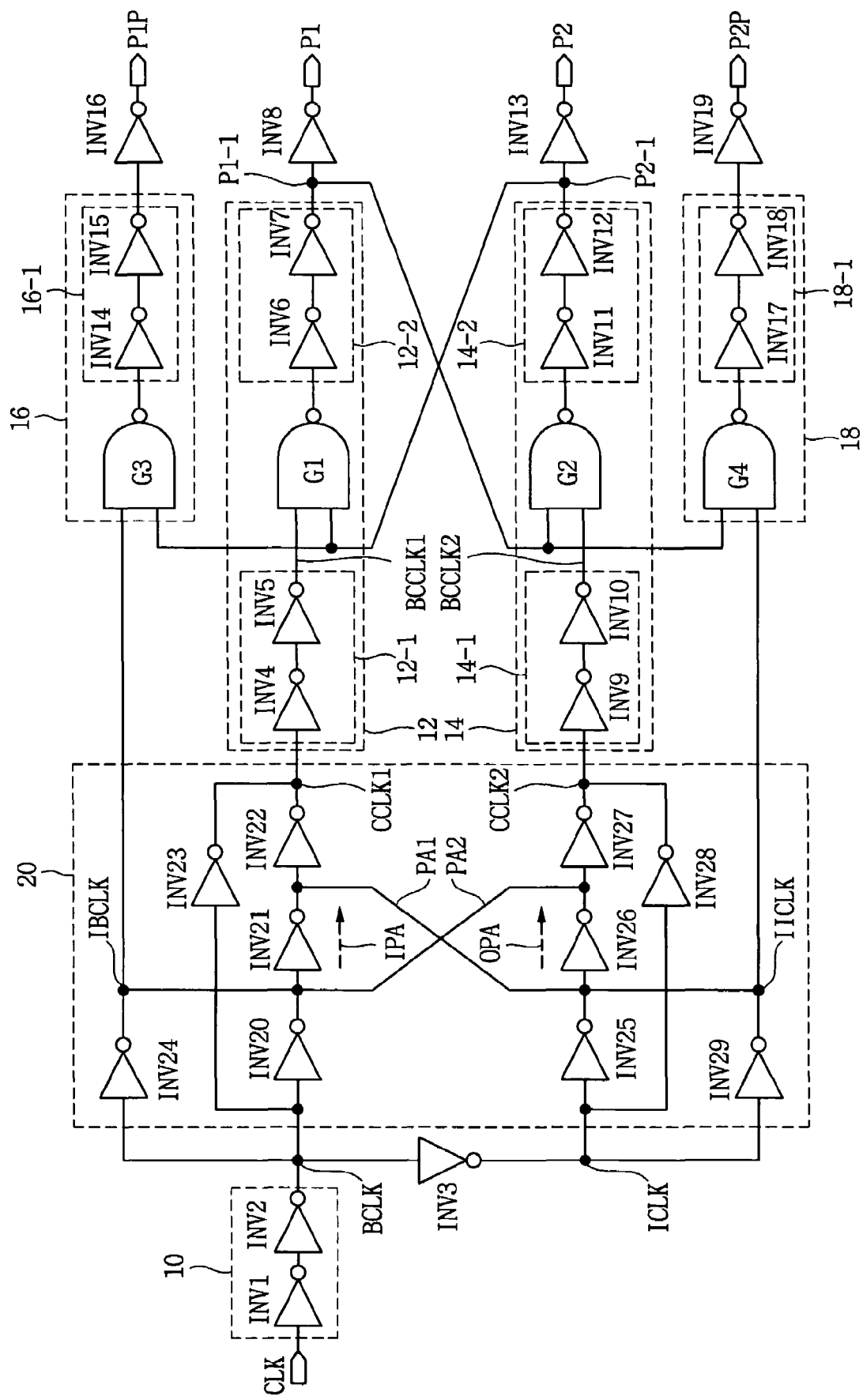
FIG. 5 is a circuit diagram showing a multi-phase clock signal generator according to further embodiments of the present invention.

FIG. 5 is a circuit diagram showing a multi-phase clock signal generator according to embodiments of the present invention. The multi-phase clock signal generator of FIG. 5 further includes a duty ratio compensation circuit that receives the buffered clock signal and provides clock signals for use by the clock signal generator of FIG. 3. Accordingly, in FIG. 5, the same reference numerals denote the same elements in FIG. 3, and thus the detailed descriptions of the same elements will be omitted.

The duty ratio compensation circuit 20 includes inverters INV20 through INV29. Three cascade connected inverters INV20, INV21 and INV22 are connected between an output terminal of the input buffer 10 and an input terminal of the first logic circuit 12. The inverter INV23 is connected between the output terminal of the input buffer 10 and the input terminal of the first logic circuit 12. The inverter INV24 is connected between the output terminal of the input buffer 10 and an input terminal of the inverter INV21. An output terminal of the inverter INV24 is connected to an input terminal of the third logic circuit 16.

Three cascade connected inverters INV25, INV26 and INV27 are connected between an output terminal of the inverter INV3 and an input terminal of the second logic circuit 14. The inverter INV28 is connected between the output terminal of the inverter INV3 and the input terminal of the second logic circuit 14. The inverter INV29 is connected between the output terminal of the inverter INV3 and the input terminal of the inverter INV26. An output terminal of the inverter INV29 is connected to an input terminal of the fourth logic circuit 18.

An output terminal of the inverter INV21 is connected to the input terminal of inverter INV26 through the first pass PA1 and an output terminal of the inverter INV26 is connected to the input terminal of inverter INV21 through the second pass PA2.

Figure 6A:
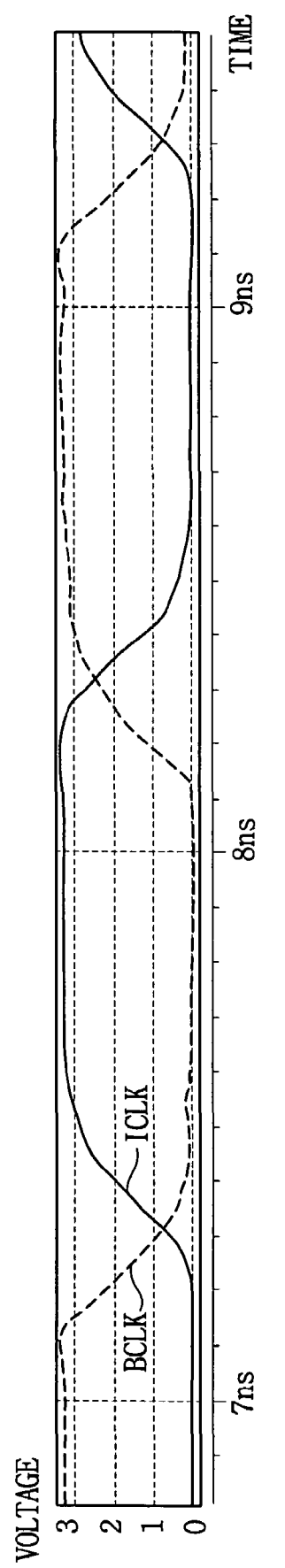
FIGS. 6A, 6B, 6C, 6D, 6E, 6F and 6G are timing diagrams showing the operation of the multi-phase clock signal generator of FIG. 5.

The input buffer 10 buffers the input clock signal CLK. The inverter INV3 inverts the buffered input clock signal BCLK represented by a dotted line in FIG. 6A. The inverted input clock signal ICLK represented by a solid line in FIG. 6A and the buffered input clock signal BCLK respectively are applied to the duty ratio compensation circuit 20.

The duty ratio compensation circuit 20 reduces a difference of phase delay between an in-phase path IPA and an inverse phase path OPA using the first and second paths PA1 and PA2.

In addition, since the inverter INV23 is connected in parallel to the three inverters INV20, INV21 and INV22, one-stage delay (1d) and three-stage delay (3d) signals are combined in the path IPA, so that the path IPA has a two-stage delay (2d). Because the inverter INV28 is connected in parallel to the three inverters INV25, INV26 and INV27, one-stage delay (1d) and three-stage delay (3d) signals are combined in the path OPA, so that the path OPA has a two-stage delay (2d). Therefore, a total delay of the path IPA or the path OPA is reduced by one-stage delay.

In addition, the output terminal of the inverter INV24 is connected to the output terminal of the three cascade connected inverters INV3, INV25 and INV26, and the output terminal of two cascade connected inverters INV20 and INV21 is connected to the output terminal of two cascade connected inverters INV3 and INV29. Thus, the phase delay between the paths IPA and OPA is reduced, and the duty cycle difference between the paths IPA and OPA is reduced.

FIGS. 6B, 6C, 6D, 6E, 6F and 6G are timing diagrams showing the operation of the multi-phase clock signal generator of FIG. 5.

Figure 6B:
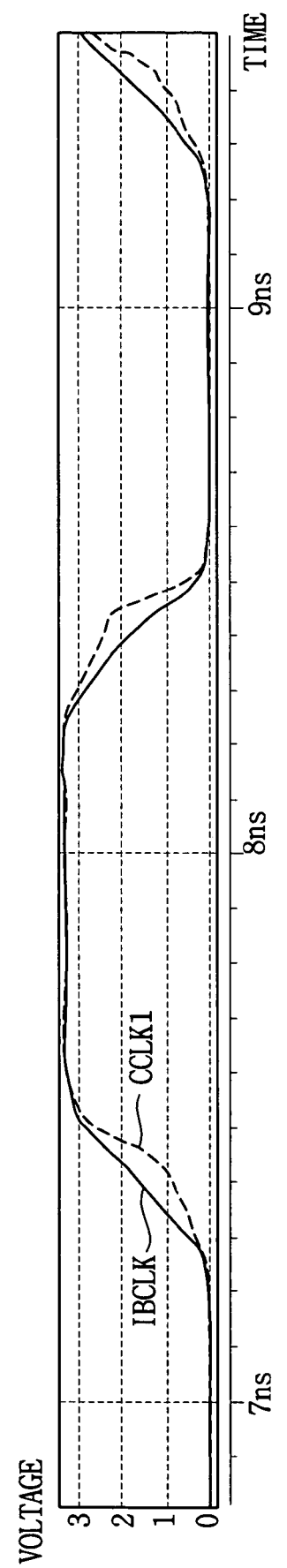
Figure 6C:
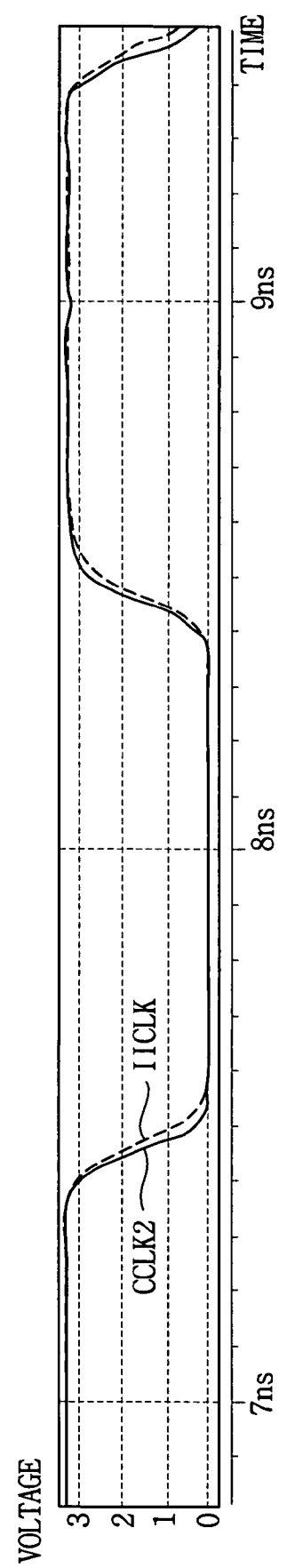
Figure 6D:
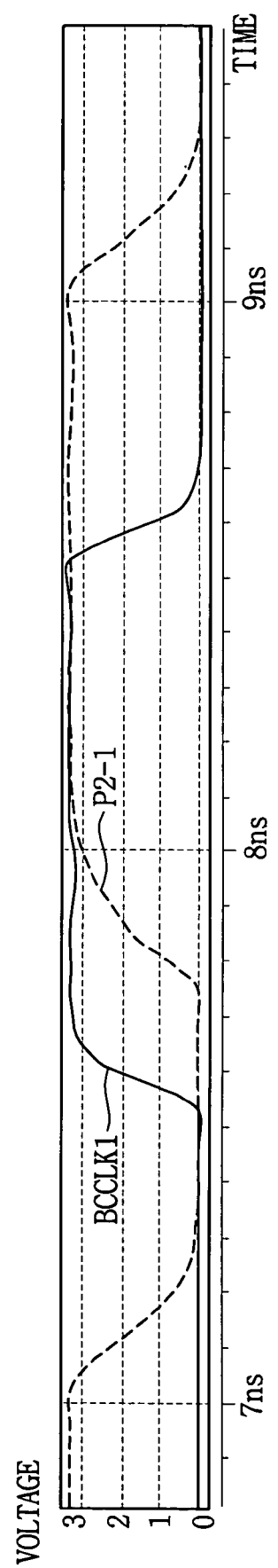
Figure 6E:
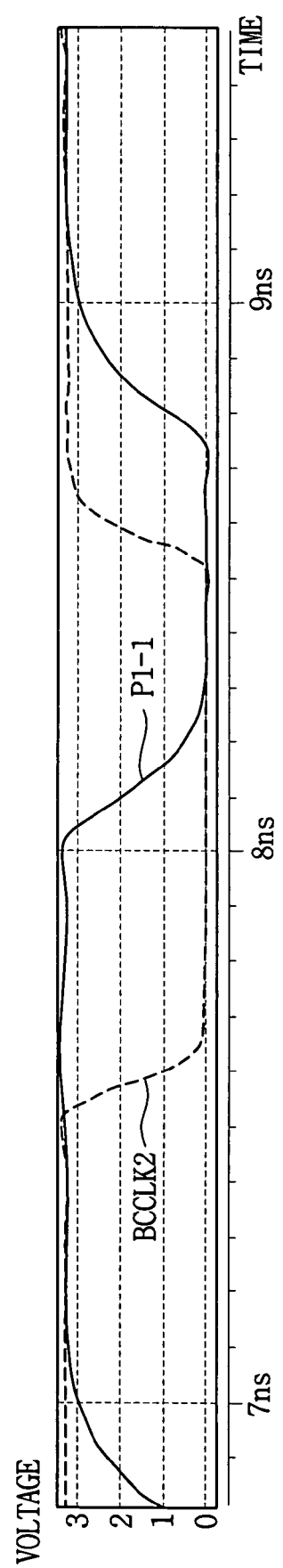
Figure 6F:
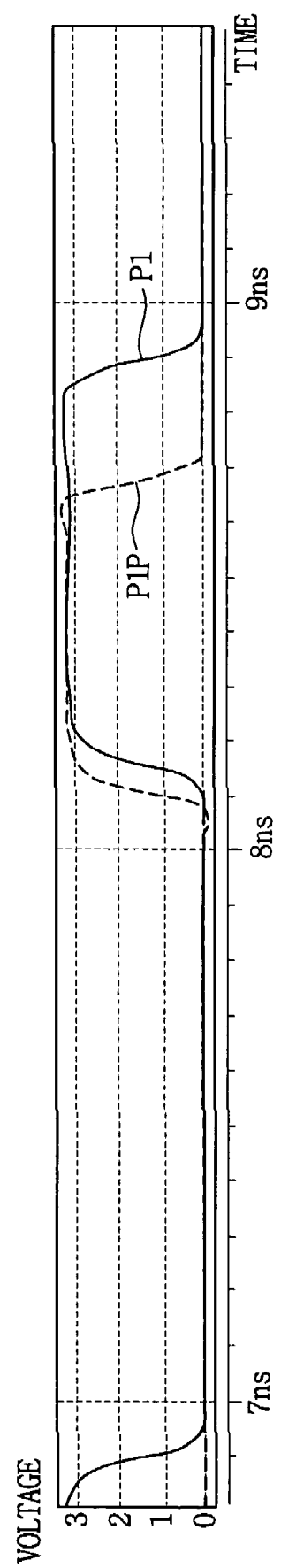

A second compensated input clock signal CCLK2 of FIG. 6C is generated in response to an IBCLK signal of FIG. 6B. A first compensated input clock signal CCLK1 of FIG. 6B is generated in response to an IICLK signal of FIG. 6C. A rising edge of the CCLK1 signal rises slowly at first in response to the BCLK signal, and then rises rapidly with a rapid slope in response to IICLK signal. A falling edge of the CCLK1 signal drops slowly at first, and then drops rapidly with a rapid slope. Thus, a falling edge of a BCCLK1 signal of FIG. 6D is delayed due to the two-step transition of the falling edge of the CCLK1 signal. Thus, a rising edge of the P1-1 signal of FIG. 6E is delayed, and a falling edge of the P1 signal of FIG. 6F is delayed. Since a rising edge of the P2-1 signal rises rapidly at first and then rises slowly, a falling edge of the P1-1 signal is shifted forward, and a rising edge of the P1 signal is shifted forward.

Therefore, a width of an active period of the P1 signal is widened since the rising edge of the P1 signal is shifted forward and the falling edge of the P1 signal is delayed.

Figure 6G:
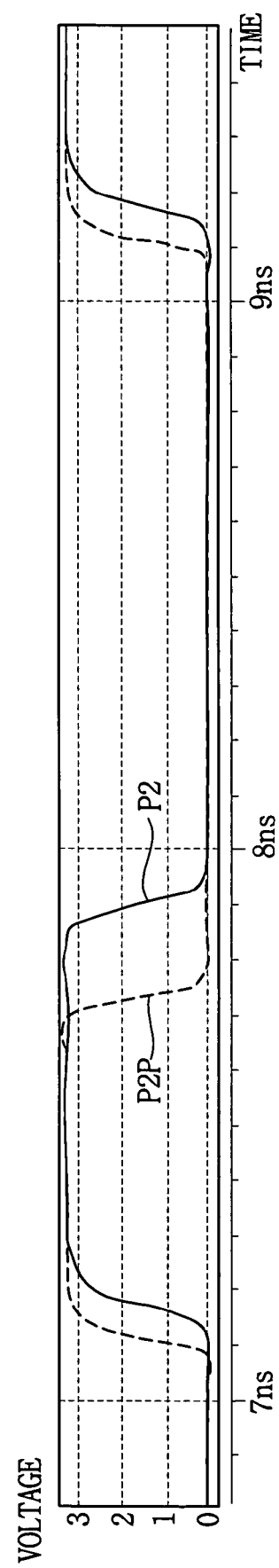

Since a CCLK2 signal of FIG. 6C is generated in response to an IBCLK signal of FIG. 6B, a BCCLK2 signal of FIG. 6E is generated in response to a falling edge of the CCLK2 signal of FIG. 6C. A rising edge of the P2-1 signal of FIG. 6D is formed in response to a falling edge of the BCCLK2 signal. Thus, a falling edge of the P2 signal of FIG. 6G is formed in response to the rising edge of the P2-1 signal of FIG. 6D. A falling edge of the P2-1 signal is formed in response to the rising edge of the P1-1 signal of FIG. 6E. A rising edge of the P2 signal is formed in response to the falling edge of the P2-1 signal.

Thus, a width of an active period of the P2 signal is prevented from being widen since the falling edge of the P2 signal is prevented from being shifted backward (or delayed) in response to the IBCLK signal.

Therefore, according to the above duty cycle compensation, the first compensated input clock signal CCLK1 that is applied to the first logic circuit 12 has substantially the same delay characteristics and the same duty cycle characteristics as those of the second compensated input clock signal CCLK2 that is applied to the second logic circuit 14. As shown in FIGS. 6D and 6E, the BCCLK1 signal of FIG. 6D has the same delay characteristics and the same duty cycle characteristics as those of the BCCLK2 signal of FIG. 6E.

Since the CCLK1 and CCLK2 signals having substantially the same delay characteristics and the same duty cycle characteristics as each other are applied to the first and second logic signal 12 and 14, respectively, the first clock signal P1 has substantially the same delay characteristics and the same duty cycle characteristics as those of the second clock signal P2.

In addition, according to the above described duty cycle compensation, the third clock signal P1P has substantially the same delay characteristics and the same duty cycle characteristics as those of the fourth clock signal P2P.

The IBCLK signal has three-stage delays (3d), and the IICLK signal has four-stage delays (4d). However, the IBCLK signal is mixed with an inverted signal of the IICLK signal, and the IICLK signal is mixed with an inverted signal of the IBCLK signal. The inverted signal of the IICLK signal has five-stage delays (5d), and the inverted signal of the IBCLK signal has four-stage delays (4d). Thus, since the phase delay between the IBCLK and IICLK signals is shared by the IBCLK and IICLK signals, the differential in the delay between the IBCLK and IICLK signals may be reduced or even minimized.

Figure 7A:
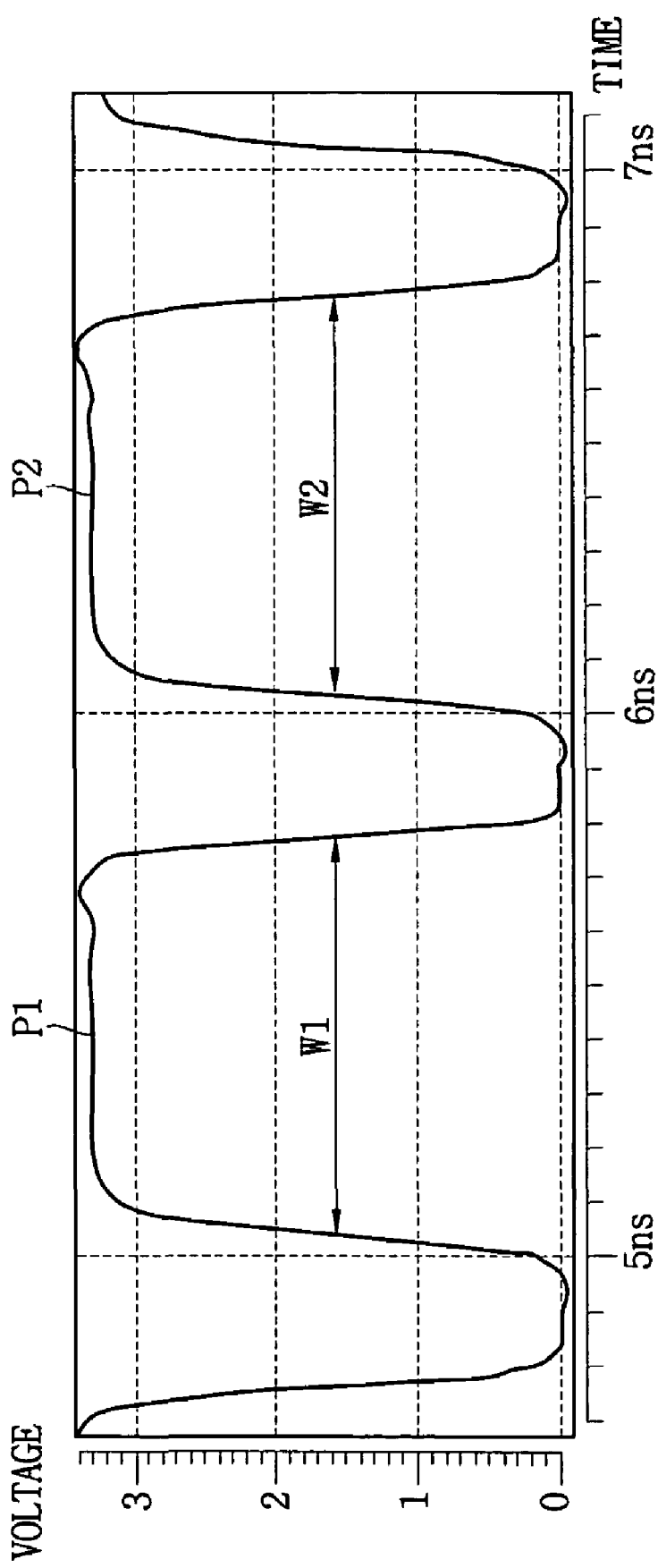
FIGS. 7A and 7B are timing diagrams showing the duty ratios of the clock signals of FIG. 5 and FIG. 3, respectively.
Figure 7B:
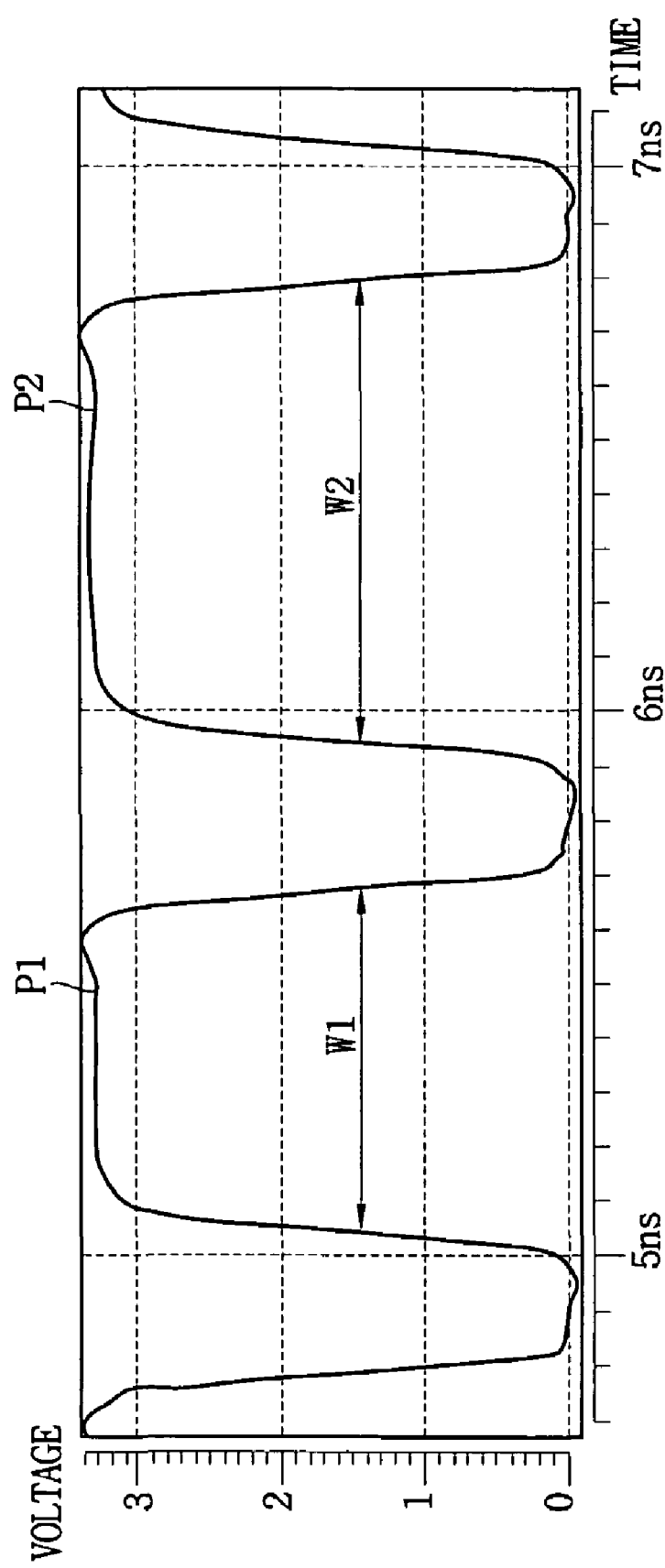

FIGS. 7A and 7B are timing diagrams showing the duty ratios of the clock signals of FIG. 5 and FIG. 3, respectively.

Referring to FIG. 7B, a width W1 of the active period of the first clock signal P1 is narrower than a width W2 of the active period of the second clock signal P2 according to the clock signal generator of FIG. 3.

Referring to FIG. 7A, the width W1 of the active period of the first clock signal P1 is substantially the same as the width W2 of the active period of the second clock signal P2 according to the multi-phase clock signal generator of FIG. 5.

While the exemplary embodiments of the present invention and its advantages have been described in detail, it should be understood that various changes, substitutions and alterations can be made herein without departing from the scope of the invention as defined by appended claims.

What is claimed is:

1. A multi-phase clock signal generator comprising:
    a first inverter that is configured to invert an input clock signal to generate an inverted input clock signal that is delayed with respect to the input clock signal;
    a duty cycle compensation circuit that is configured to receive the input clock signal and the inverted input clock signal and to generate a first compensated input clock signal and a substantially complementary second compensated input clock signal having substantially the same duty cycle and substantially the same delay with respect to the input clock signal;
    a first logic circuit that is configured to generate a second delayed signal using the first compensated input clock signal and a first delayed signal, the first delayed signal having a substantially same phase as a phase of the input clock signal and having a first delay with respect to the input clock signal, the second delayed signal having a substantially inverted phase with respect to the input clock signal and having a second delay with respect to the input clock signal;
    a second logic circuit that is configured to generate the first delayed signal using the second compensated input clock signal and the second delayed signal;
    a second inverter that is configured to invert the second delayed signal to generate a first output clock signal; and
    a third inverter that is configured to invert the first delayed signal to generate a second output clock signal,
    wherein the duty cycle compensation circuit includes:
    an input buffer that provides the input clock signal;
    a first set of three cascade connected inverters coupled between an output terminal of the input buffer and an input terminal of the first logic circuit;
    a second set of three cascade connected inverters coupled between an output terminal of the first inverter and an input terminal of the second logic circuit, a first inverter of the second set of three cascade connected inverters having an output coupled to an input of a third inverter of the first set of three cascade connected inverters and a first inverter of the first set of three cascade connected inverters having an output coupled to an input of a third inverter of the second set of three cascade connected inverters;
    a fourth inverter coupled between an input terminal of the first set of three cascade connected inverters and an output terminal of the first set of three cascade connected inverters; and
    a fifth inverter coupled between an input terminal of the second set of three cascade connected inverters and an output terminal of the second set of three cascade connected inverters.

2. The multi-phase clock signal generator of claim 1, further including:
    a sixth inverter coupled between the output terminal of the input buffer and an output terminal of the first inverter of the first set of three cascade connected inverters; and a seventh inverter coupled between the output terminal of the first inverter and an output terminal of the first inverter of the second set of three cascade connected sixth inverters.

3. The multi-phase clock signal generator of claim 2, further comprising:
a third logic circuit that is configured to generate a third clock signal using an output signal of the sixth inverter and the first delayed signal; and
a fourth logic circuit that is configured to generate a fourth clock signal using an output signal of the seventh inverter and the second delayed signal.

4. The multi-phase clock signal generator of claim 3, wherein the third logic circuit includes:
a first NAND gate for receiving an output signal of the sixth inverter and the first delayed signal; and
a buffer that is configured to buffer an output signal of the first NAND gate;
wherein the fourth logic circuit includes:
a second NAND gate for receiving an output signal of the seventh inverter and the second delayed signal; and
a buffer that is configured to buffer an output signal of the second NAND gate.

5. The multi-phase clock signal generator of claim 1, wherein the first logic circuit includes:
a first buffer that is configured to buffer the first compensated input clock signal;
a first NAND gate for receiving an output signal of the first buffer and the first delayed signal; and
a second buffer that is configured to buffer an output signal of the first NAND gate to generate the second delayed signal; and
wherein the second logic circuit includes:
a third buffer that is configured to buffer the second compensated input clock signal;
a second NAND gate for receiving an output signal of the third buffer and the second delayed signal; and
a fourth buffer that is configured to buffer an output signal of the second NAND gate to generate the first delayed signal.

6. A method of generating a plurality of clock signals having multi-phase comprising:
inverting an input clock signal to generate an inverted input clock signal that is delayed with respect to the input clock signal;
generating a first compensated input clock signal and a second compensated input clock signal from the input clock signal and the inverted input clock signal, the first and second compensated input clock signals having substantially the same duty cycle and substantially the same delay with respect to the input clock signal;
generating a second delayed signal using the first compensated input clock signal and a first delayed signal, the first delayed signal having a substantially same phase as a phase of the input clock signal and having a first delay with respect to the input clock signal, the second delayed signal having a substantially inverted phase with respect to the input clock signal and having a second delay with respect to the input clock signal;
generating the first delayed signal using the second compensated input clock signal and the second delayed signal;
inverting the second delayed signal to generate the first clock signal; and
inverting the first delayed signal to generate the second clock signal, wherein generating a first compensated input clock signal and a second compensated input clock signal comprises:
inverting the input clock signal to generate a first signal;
inverting the input clock signal to generate a second signal;
inverting the input clock signal to generate a third signal;
inverting the inverted input clock signal to generate a fourth signal;
inverting the inverted input clock signal to generate a fifth signal;
inverting the inverted input clock signal to generate a sixth signal;
inverting a first node signal to generate a first composite signal, the first node signal mixing with the first signal, the third signal and a second composite signal;
inverting a second node signal to generate the second composite signal, the second node signal mixing with the fourth signal, the sixth signal and the first composite signal;
mixing a seventh signal with the second signal to generate the first compensated input clock signal, the seventh signal having an inverted phase with respect to the first composite signal; and
mixing an eighth signal with the fifth signal to generate the second compensated input clock signal, the eighth signal having an inverted phase with respect to the second composite signal.

7. The method of claim 6, further comprising:
generating a third clock signal using the first signal and the first delayed signal; and
generating a fourth clock signal using the sixth signal and the second delayed signal.

8. The method of claim 6, wherein said generating the second delayed signal includes:
buffering the first compensated input clock signal to output a buffered first compensated input clock signal;
performing a logical NAND operation on the buffered first compensated input clock signal and the first delayed signal; and
buffering a result of the NAND operation to generate the second delayed signal.

9. The method of claim 6, wherein said generating the first delayed signal includes:
buffering the second compensated input clock signal to output a buffered second compensated input clock signal;
performing a logical NAND operation on the buffered second compensated input clock signal and the second delayed signal; and
buffering a result of the NAND operation to generate the first delayed signal.

10. A multi-phase clock signal generator, comprising:
a clock signal generator circuit configured to receive an input clock signal and to generate a first delayed clock signal that has a first phase with respect to the input clock signal and a second delayed clock signal that has a phase that is substantially the phase of the first delayed clock signal inverted, wherein the first delayed clock signal and the second delayed clock signal are delayed substantially a same amount with respect to the input clock signal and have substantially the same duty cycle characteristics, wherein the clock signal generator circuit comprises:
an input inverter circuit that inverts the input clock signal to provide an inverted input clock signal;

first and second cross-coupled sequential inverter circuits, wherein the first cross-coupled invert circuit receives the input clock signal as an input and the second cross-coupled inverter circuit receives the inverted input clock signal as an input; and a first inverter circuit having an input coupled to the input of the first cross-coupled sequential inverter circuits and an output coupled to the output of the first cross-coupled;

a second inverter circuit having an input coupled to the input of the second cross-coupled sequential inverter circuits and an output coupled to the output of the second cross-coupled; and wherein the output of the first cross-coupled sequential inverter circuit and the output of the first inverter circuit provide the first delayed clock signal and the output of the second cross-coupled sequential inverter circuit and the output of the second inverter circuit provides the second delayed clock signal.

11. The multi-phase clock signal generator of claim 10, wherein the first and second cross-coupled sequential inverter circuits are cross-coupled by an output of a first inverter in the first cross-coupled sequential inverter circuit being coupled to an output of a second inverter in the second cross-coupled sequential inverter circuit that is a subsequent inverter to a third inverter in the second cross-coupled sequential inverter circuits that corresponds to the location in the sequence of inverters of the first inverter in the first cross-coupled sequential inverter circuit and an output of the third inverter being coupled to an output of a fourth inverter in the first cross-coupled sequential inverter circuits that is subsequent to the first inverter in the first cross-coupled sequential inverter circuit.

12. The multi-phase clock signal generator of claim 11, further comprising first and second NAND circuits, wherein the first NAND circuit performs a logical NAND of an output signal of the first cross-coupled sequential inverter circuit with an output signal of the second NAND circuit to provide a first clock signal and the second NAND circuit performs a logical NAND of an output signal of the second cross-coupled sequential inverter circuit with an output signal of the first NAND circuit to provide a second clock signal.

13. The multi-phase clock signal generator of claim 12, further comprising:
a first buffer circuit between the output of the first cross-coupled sequential inverter circuit and the first NAND circuit such that the first NAND circuit provides a logical NAND of a buffered output signal of the first cross-coupled sequential inverter circuit; and
a second buffer circuit between the output of the second cross-coupled sequential inverter circuit and the second NAND circuit such that the second NAND circuit provides a logical NAND of a buffered output signal of the second cross-coupled sequential inverter circuit.

14. The multi-phase clock signal generator of claim 13, further comprising:
a third buffer circuit between the output of the second NAND circuit and the first NAND circuit such that the first NAND circuit provides a logical NAND of a buffered output signal of the second NAND circuit; and
a fourth buffer circuit between the output of the first NAND circuit and the second NAND circuit such that the second NAND circuit provides a logical NAND of a buffered output signal of the first NAND circuit.

15. The multi-phase clock signal generator of claim 14, further comprising:
a third inverter circuit that inverts the buffered output signal of the first NAND circuit to provide the first clock signal; and
a fourth inverter circuit that inverts the buffered output signal of the second NAND circuit to provide the second clock signal.

16. The multi-phase clock signal generator of claim 14, further comprising:
a third inverter circuit coupled between an input and an output of an inverter of the first cross-coupled sequential inverter circuit;
a fourth inverter circuit coupled between an input and an output of an inverter of the second cross-coupled sequential inverter circuit; and
third and fourth NAND circuits, wherein the third NAND circuit performs a logical NAND of an output signal of the third inverter circuit with an output signal of the third buffer circuit to provide a third clock signal and the fourth NAND circuit performs a logical NAND of an output signal of the fourth inverter circuit with an output signal of the fourth buffer circuit to provide a fourth clock signal.

17. The multi-phase clock signal generator of claim 12, further comprising:
a third inverter circuit coupled between an input and an output of an inverter of the first cross-coupled sequential inverter circuit;
a fourth inverter circuit coupled between an input and an output of an inverter of the second cross-coupled sequential inverter circuit; and
third and fourth NAND circuits, wherein the third NAND circuit performs a logical NAND of an output signal of the third inverter circuit with an output signal of the second NAND circuit to provide a third clock signal and the fourth NAND circuit performs a logical NAND of an output signal of the fourth inverter circuit with an output signal of the first NAND circuit to provide a fourth clock signal.

* * * * *